(12) United States Patent
Cheng et al.

(10) Patent No.: US 12,213,277 B2
(45) Date of Patent: Jan. 28, 2025

(54) AIR COOLING SYSTEM

(71) Applicants: Inventec (Pudong) Technology Corporation, Shanghai (CN); INVENTEC CORPORATION, Taipei (TW)

(72) Inventors: Yi-Lun Cheng, Taipei (TW); Chih Kai Yang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 257 days.

(21) Appl. No.: 17/813,607

(22) Filed: Jul. 20, 2022

(65) Prior Publication Data
US 2023/0397364 A1    Dec. 7, 2023

(30) Foreign Application Priority Data

Jun. 2, 2022    (CN) .......................... 202210623864.3

(51) Int. Cl.
*H05K 7/20*    (2006.01)

(52) U.S. Cl.
CPC ....... *H05K 7/20154* (2013.01); *H05K 7/2039* (2013.01)

(58) Field of Classification Search
CPC .......................... H05K 7/20154; H05K 7/2039
USPC ......................................................... 165/80.3
See application file for complete search history.

(56) References Cited

U.S. PATENT DOCUMENTS

| | | | |
|---|---|---|---|
| 9,087,804 B2 | 7/2015 | Wong et al. | |
| 10,423,200 B1* | 9/2019 | North ................... | G06F 1/1616 |
| 10,969,838 B2 | 4/2021 | He et al. | |
| 11,016,529 B1* | 5/2021 | Tucker ................ | G06F 1/1647 |
| 11,775,034 B2 | 10/2023 | Chen et al. | |
| 11,877,381 B2* | 1/2024 | Cheng ................ | H05K 7/20172 |
| 2006/0196639 A1* | 9/2006 | Yang ................... | H01L 23/4093 |
| | | | 165/83 |
| 2006/0196643 A1 | 9/2006 | Hata et al. | |
| 2013/0327507 A1 | 12/2013 | Degner et al. | |
| 2015/0116928 A1 | 4/2015 | Delano et al. | |
| 2017/0153677 A1 | 6/2017 | Cheng et al. | |

(Continued)

FOREIGN PATENT DOCUMENTS

| | | |
|---|---|---|
| EP | 1621970 A2 | 2/2006 |
| TW | M502876 U | 6/2015 |

(Continued)

*Primary Examiner* — Raheena R Malik
(74) *Attorney, Agent, or Firm* — CKC & Partners Co., LLC

(57) ABSTRACT

An air cooling system for electronic devices includes a body, a thermal conduction component, and a heat dissipation fan. The body has a heat dissipation port and air inlet ports. The air inlet ports are disposed at a first housing part and a second housing part of the body. The first housing part is opposite to the second housing part. The thermal conduction component is disposed in the body and configured to contact a heat source. The heat dissipation fan is disposed in the body. The heat dissipation fan includes a first axial air inlet opening, a second axial air inlet opening, and radial air outlet openings. The first axial air inlet opening corresponds to one of the air inlet ports of the first housing part. The second axial air inlet opening corresponds to one of the air inlet ports of the second housing part.

14 Claims, 10 Drawing Sheets

(56) References Cited

U.S. PATENT DOCUMENTS

| | | |
|---|---|---|
| 2019/0050031 A1 | 2/2019 | Utz et al. |
| 2020/0128692 A1 | 4/2020 | Singh et al. |
| 2020/0396864 A1 | 12/2020 | Ku et al. |
| 2021/0149463 A1* | 5/2021 | Lu ........................ H05K 7/20154 |
| 2022/0302757 A1* | 9/2022 | Pei .......................... H01F 38/14 |
| 2022/0400582 A1 | 12/2022 | Lin et al. |
| 2023/0066801 A1* | 3/2023 | Lin ........................ G06F 1/1656 |
| 2023/0397362 A1* | 12/2023 | Yang .................. H05K 7/20145 |
| 2023/0397363 A1* | 12/2023 | Cheng ................. H05K 7/20172 |
| 2023/0397364 A1* | 12/2023 | Cheng .................. H05K 7/2039 |
| 2023/0397365 A1* | 12/2023 | Yang .................... H05K 7/2039 |
| 2023/0422446 A1 | 12/2023 | Hashiba et al. |

FOREIGN PATENT DOCUMENTS

| | | | |
|---|---|---|---|
| TW | 201925954 A | * | 7/2019 |
| TW | 202131783 A | | 8/2021 |
| TW | M620617 U | | 12/2021 |
| TW | I763256 B | | 5/2022 |

\* cited by examiner

AIR COOLING SYSTEM

CROSS-REFERENCE TO RELATED APPLICATION

This application claims priority to China Application Serial Number 202210623864.3, filed Jun. 2, 2022, which is herein incorporated by reference.

BACKGROUND

Technical Field

The present disclosure relates to an air cooling system, and more particularly, to an air cooling system used in an electronic device.

Description of Related Art

The advancement of high-performance electronic devices has increased the demand for high-efficiency cooling, especially for gaming laptops. As processor performance improves, the air cooling system of gaming laptops has therefore become more complicated and bulky to enhance cooling and prevent overheating. Therefore, the thickness of gaming laptops is greater than that of ordinary laptops. The weight of gaming laptops is also greater, leading to less portability.

Accordingly, how to provide an air cooling system for electronic devices such as gaming laptops which solve the aforementioned problems has become an important issue to be solved by those in the industry.

SUMMARY

An aspect of the disclosure is to provide an air cooling system that may efficiently solve the aforementioned problems.

According to an embodiment of the disclosure, an air cooling system includes a body, a thermal conduction component, and a heat dissipation fan. The body has a heat dissipation port and a plurality of air inlet ports. The air inlet ports are disposed at a first housing part and a second housing part of the body. The first housing part is opposite to the second housing part. The thermal conduction component is disposed in the body and configured to thermally contact a heat source. The heat dissipation fan is disposed in the body. The heat dissipation fan includes a first axial air inlet opening, a second axial air inlet opening, and a plurality of radial air outlet openings. The first axial air inlet opening corresponds to one of the air inlet ports of the first housing part. The second axial air inlet opening is opposite to the first axial air inlet opening. The second axial air inlet opening corresponds to one of the air inlet ports of the second housing part. A working fluid generated by the heat dissipation fan flows from the radial air outlet openings to the thermal conduction component in different directions.

In an embodiment of the disclosure, the body further includes a side housing part. The side housing part is connected between the first housing part and the second housing part. The heat dissipation port is disposed at the side housing part.

In an embodiment of the disclosure, the thermal conduction component fully encircles the heat dissipation fan.

In an embodiment of the disclosure, the thermal conduction component partially encircles the heat dissipation fan.

In an embodiment of the disclosure, the thermal conduction component includes a vapor chamber, a heat pipe, a graphite sheet, or a highly conductive metal.

In an embodiment of the disclosure, the body further includes at least one retractable stand connected to a side of the second housing part away from the first housing part.

In an embodiment of the disclosure, the body further includes at least one blocking pad connected to a side of the second housing part away from the first housing part. The at least one blocking pad is disposed between the air inlet ports of the second housing part and the heat dissipation port.

In an embodiment of the disclosure, the air cooling system further includes a cooling fan disposed adjacent to the thermal conduction component. The cooling fan includes a third axial air inlet opening, a fourth axial air inlet opening, and a side air outlet opening. The third axial air inlet opening corresponds to another of the air inlet ports of the first housing part. The fourth axial air inlet opening is opposite to the third axial air inlet opening. The fourth axial air inlet opening corresponds to another of the air inlet ports of the second housing part.

In an embodiment of the disclosure, the thermal conduction component fully encircles the heat dissipation fan.

In an embodiment of the disclosure, the thermal conduction component partially encircles the heat dissipation fan.

In an embodiment of the disclosure, the thermal conduction component includes a vapor chamber, a heat pipe, a graphite sheet, or a highly conductive metal.

In an embodiment of the disclosure, the body further includes at least one retractable stand connected to a side of the second housing part away from the first housing part.

In an embodiment of the disclosure, the side air outlet opening of the cooling fan directs toward the heat dissipation port.

In an embodiment of the disclosure, the body further includes at least one blocking pad connected to a side of the second housing part away from the first housing part. The at least one blocking pad is disposed between the air inlet ports of the second housing part and the heat dissipation port.

In an embodiment of the disclosure, the side air outlet opening of the cooling fan directs away from the heat dissipation port. A cooling port is disposed at the side housing part and corresponds to the side air outlet opening. The thermal conduction component further includes at least one heat conducting element extending between the side air outlet opening and the cooling port.

In an embodiment of the disclosure, the body further includes at least one blocking pad connected to a side of the second housing part away from the first housing part. The at least one blocking pad is disposed between the air inlet ports of the second housing part and the heat dissipation port or the cooling port.

In an embodiment of the disclosure, the cooling fan further includes a fan housing and a first block body. The fan housing has the third axial air inlet opening, the fourth axial air inlet opening, and the side air outlet opening. The first block body surrounds the fan housing.

In an embodiment of the disclosure, the cooling fan further includes a fan housing and a plurality of second block bodies. The fan housing has the third axial air inlet opening, the fourth axial air inlet opening, and the side air outlet opening. The plurality of second block bodies are disposed at the fan housing, around outer edges of the third axial air inlet opening and the fourth axial air inlet opening, and abutting against the first housing part and the second housing part.

Accordingly, in the air cooling system of the present disclosure, through the air inlet ports disposed at the first housing part and the second housing part, the intake volume of the cold air is increased, thereby improving the cooling efficiency. In addition, the retractable stand lifts the body to increase the amount of cold air intake, particularly at the air inlet port of the second housing part. Meanwhile, to prevent hot air from flowing back into the system, the blocking pads separate the air intake of the air inlet ports of the second housing part from the air exhaust of the heat dissipation port or the cooling ports. Furthermore, by the working fluid of the heat dissipation fan, the thermal conduction component distributes the heat from the heat source. The cooling fans further enhance convection, which makes heat dissipation more effective. Therefore, compared with the air cooling systems commonly used, the air cooling system of the present disclosure can enhance cooling and prevent overheating of electronic devices.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
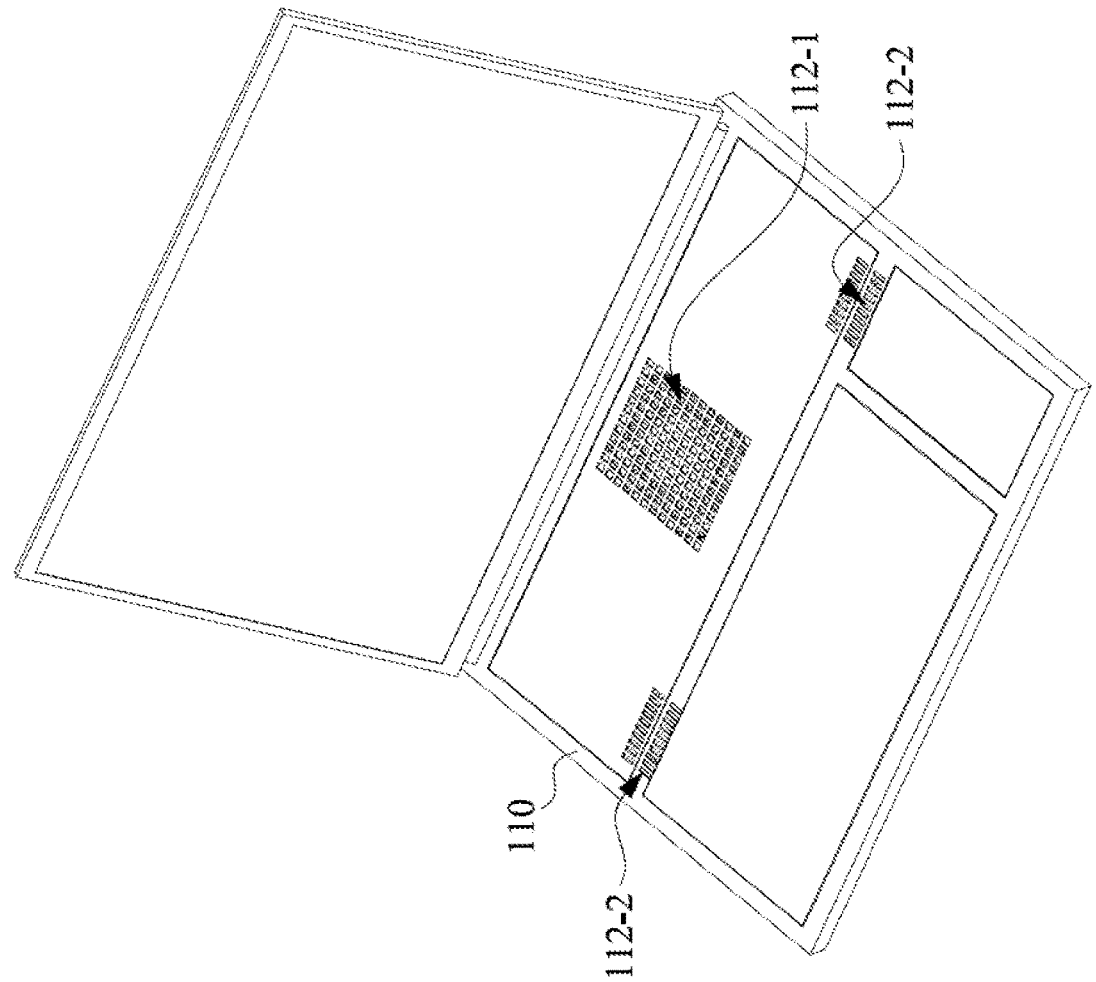
FIG. 1A is a front view of a body according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1A. FIG. 1A is a front view of a body 100 according to some embodiments of the present disclosure. As shown in FIG. 1A, the body 100 has a first housing part 110. The first housing part 110 has several air inlet ports 112-1 and 112-2. Although FIG. 1A shows only three air inlet ports 112-1 and 112-2, it should be understood that the first housing part 110 may include any number, any size, and any arrangement of air inlet ports 112-1 and 112-2, while remaining within the scope of the present disclosure. In addition, in the embodiments in which the body 100 combines with a laptop, a position adjustment is made to shift the input interfaces to leave space for the air inlet port 112-1. For example, The keyboard and the touchpad may move to the edge of the first housing part 110 away from the air inlet port 112-1.

Figure 1B:
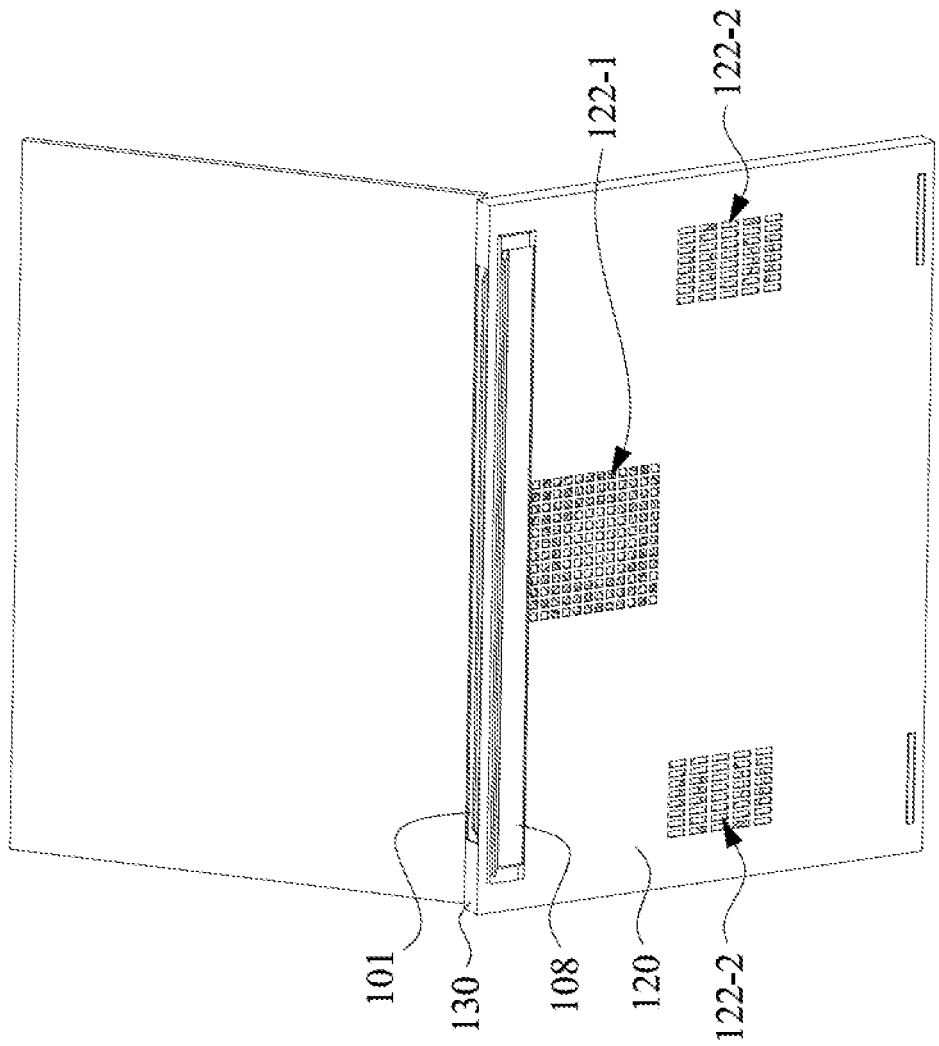
FIG. 1B is a rear view of a body according to an embodiment of the present disclosure.

Reference is made to FIG. 1B. FIG. 1B is a rear view of the body 100 according to some embodiments of the present disclosure. As shown in FIG. 1B, the body 100 has a second housing part 120. The second housing part 120 is opposite to the first housing part 110. The second housing part 120 has several air inlet ports 122-1 and 122-2. Although FIG. 1B shows only three air inlet ports 122-1 and 122-2, it should be understood that the second housing part 120 may include any number, any size, and any arrangement of air inlet ports 122-1 and 122-2, while remaining within the scope of the present disclosure. The body 100 further includes a side housing part 130. The side housing part 130 connects the first housing part 110 and the second housing part 120. As shown in FIG. 1B, the side housing part 130 has a heat dissipation port 101.

Figure 1C:
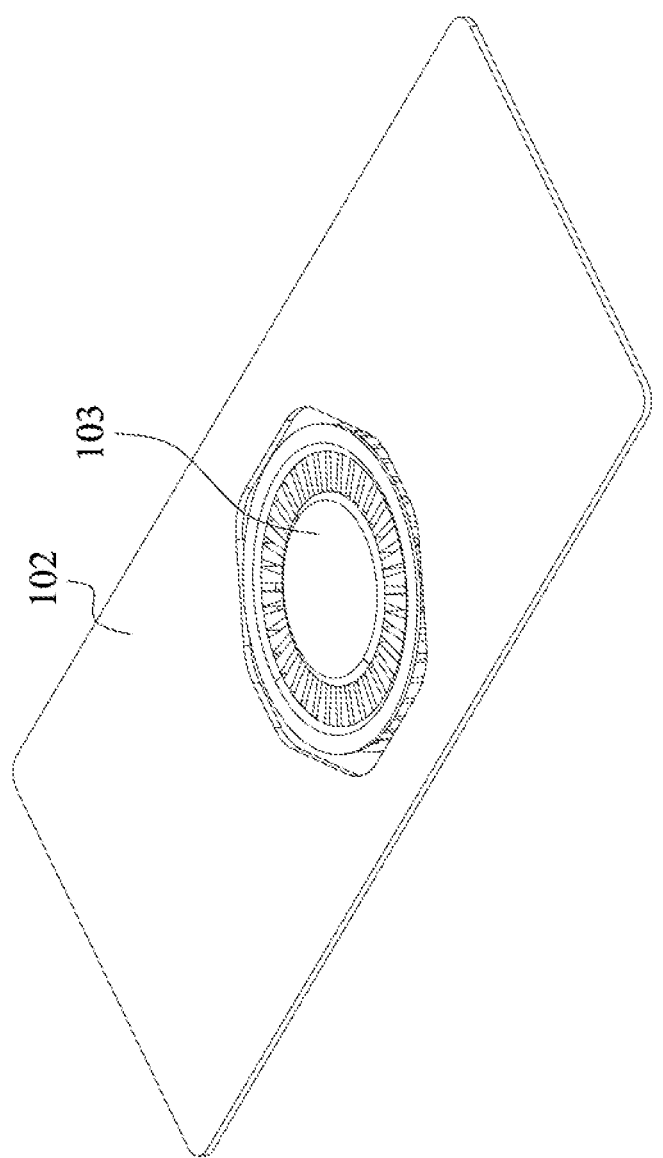
FIG. 1C is a layout of a thermal conduction component and a heat dissipation fan inside a body according to an embodiment of the present disclosure.

Reference is made to FIG. 1C. FIG. 1C is a layout of a thermal conduction component 102 and a heat dissipation fan 103 inside the body 100 according to some embodiments of the present disclosure. As shown in FIG. 1C, the thermal conduction component 102 fully encircles the heat dissipation fan 103. In some embodiments, the thermal conduction component 102 partially encircles the heat dissipation fan 103 (referring to FIG. 2A).

The thermal conduction component 102 is configured to thermally contact a heat source. The number of heat sources includes but is not limited to one. If there are two heat sources, they are disposed on opposite sides of the heat dissipation fan 103 to avoid accumulating the heat they generate. Similarly, if there are more than two heat sources, they are arranged around the heat dissipation fan 103. In the embodiments of the present disclosure, the electronic device may be, but not limited to, a portable electronic device, such as a laptop or a palmtop computer.

The thermal conduction component 102 can be a vapor chamber, a heat pipe, a graphite sheet, a highly conductive metal, a combination thereof, or a similar component that can absorb and distribute the heat. It should be understood that the thermal conduction component 102 can have different shapes and configurations in accordance with the heat dissipation fan 103 or other heat dissipation and cooling devices while remaining within the scope of the present disclosure.

Figure 1E:
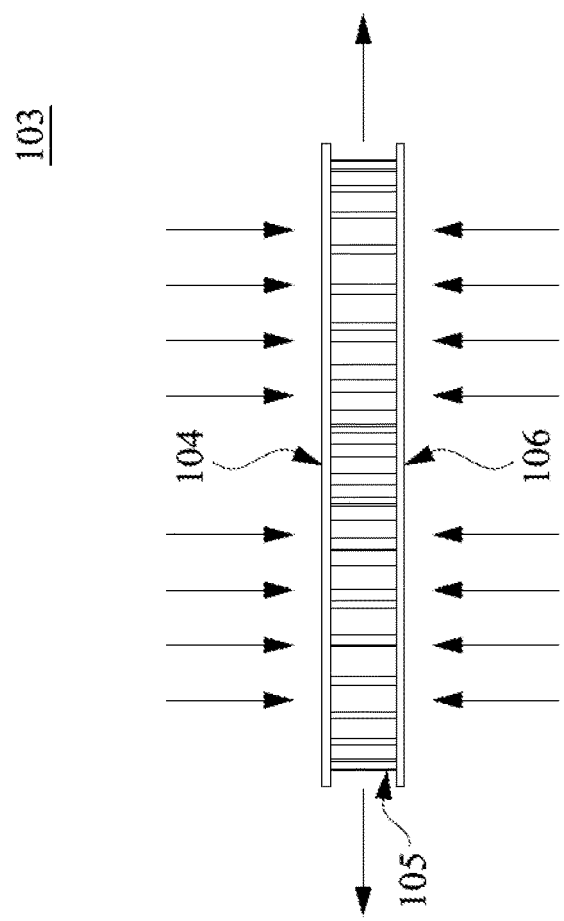
FIG. 1E is a side view of a heat dissipation fan according to an embodiment of the present disclosure.
Figure 1D:
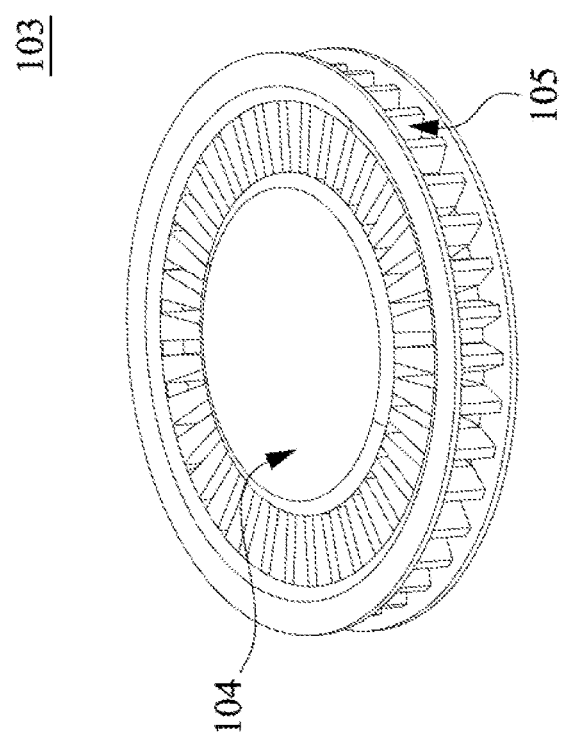
FIG. 1D is a perspective view of a heat dissipation fan according to an embodiment of the present disclosure.

Reference is made to FIG. 1D and FIG. 1E, which illustrate a perspective view and a side view of the heat dissipation fan 103 according to some embodiments of the present disclosure, respectively. As shown in FIG. 1D and FIG. 1E, the heat dissipation fan 103 includes a first axial air inlet opening 104, a second axial air inlet opening 106, and a plurality of radial air outlet openings 105. The first axial air inlet opening 104 corresponds to one of the air inlet ports 112-1 and 112-2 of the first housing part 110, such as the air inlet port 112-1 located around the center of the first housing part 110, as shown in FIG. 1A. The second axial air inlet opening 106 is opposite to the first axial air inlet opening 104. The second axial air inlet opening 106 corresponds to one of the air inlet ports 122-1 and 122-2 of the second housing part 120, such as the air inlet port 122-1 located around the center of the second housing part 120, as shown in FIG. 1B. The heat dissipation fan 103 takes in cold air from outside the system. The introduced cold air blows radially from the radial air outlet openings 105 to the thermal conduction component 102 in different directions.

As shown in FIG. 1C, the heat dissipation fan 103 is encircled by the thermal conduction component 102. The cold air blown out by the heat dissipation fan 103 can facilitate the heat dispersion from the heat source to all portions of the thermal conduction component 102, thereby increasing the heat dissipation efficiency of the thermal conduction component 102. The hot air generated thereafter is discharged outside the body 100 through the heat dissipation port 101.

Figure 1F:
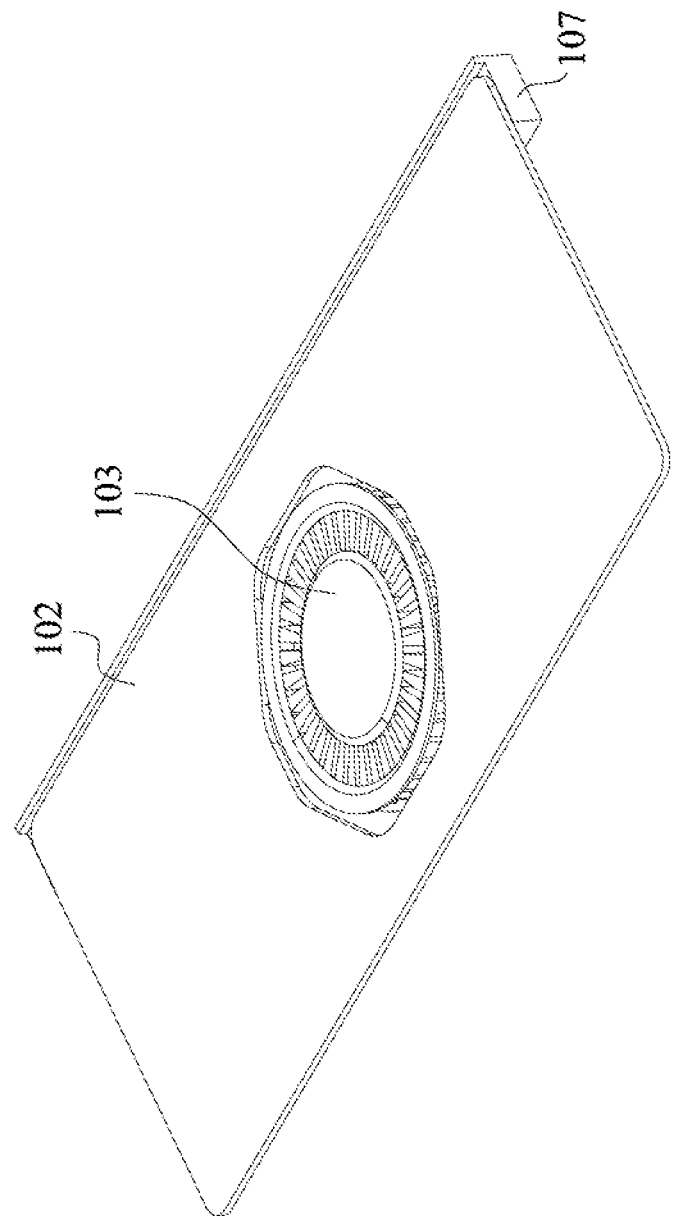
FIG. 1F is a layout of a thermal conduction component, a heat dissipation fan, and a heat exchanger inside a body according to an embodiment of the present disclosure.

Reference is made to FIG. 1F, which illustrates a layout of a thermal conduction component 102, a heat dissipation fan 103, and a heat exchanger 107 inside the body 100 according to some embodiments of the present disclosure. As shown in FIG. 1F, the heat exchanger 107, such as a heat dissipating fin, is disposed at the edge of the thermal conduction component 102. The position of the heat exchanger 107 corresponds to the heat dissipation port 101 (referring to FIG. 1B). The heat exchanger 107 is configured to increase the heat convection and radiation area, thereby improving heat dissipation efficiency.

Figure 1G:
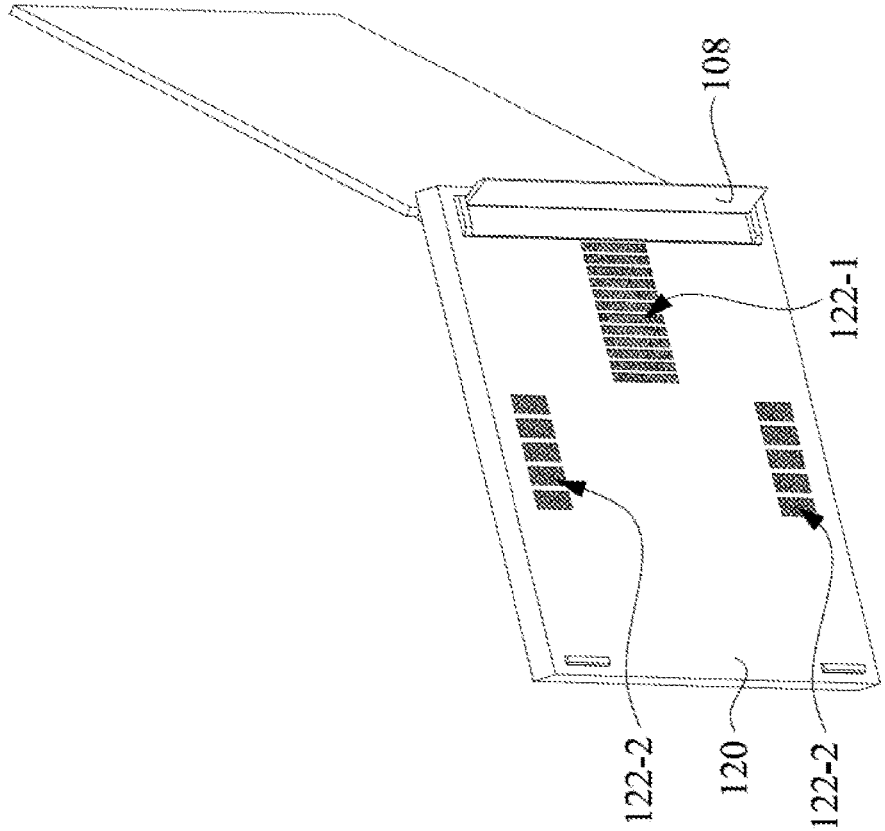
FIG. 1G is a rear view of a body according to an embodiment of the present disclosure.

Reference is made to FIG. 1G, which illustrates a rear view of the body 100 according to some embodiments of the present disclosure. In some embodiments, the body 100 further includes a retractable stand 108. As shown in FIG. 1A, the retractable stand 108 is retracted, while in FIG. 1G, the retractable stand 108 is unfolded. As shown in FIG. 1A and FIG. 1G, the retractable stand 108 is connected to a side of the second housing part 120 away from the first housing part 110. By lifting the body 100 from the ground, the retractable stand 108 increases the cold air intake volume of the air inlet ports 122-1 and 122-2 of the second housing part 120. Although FIG. 1A and FIG. 1G show only one retractable stand 108, it should be understood that the body 100 may include any number of retractable stands 108 according to cooling loads while remaining within the scope of this disclosure.

In some embodiments, the retractable stand 108 can be a solid sheet-like structure, as shown in FIG. 1A and FIG. 1G. In this case, the retractable stand 108 can act as a blocking pad either in the retracted or unfolded state. The retractable stand 108 is disposed along the side direction of the second housing part 120 and lies between the air inlet port 122-1 and the heat dissipation port 101. As such, the retractable stand 108 can prevent the return flow of the hot air discharged from the heat dissipation port 101 to the body 100 through the air inlet port 122-1, thereby reducing the overall cooling efficiency.

Figure 2A:
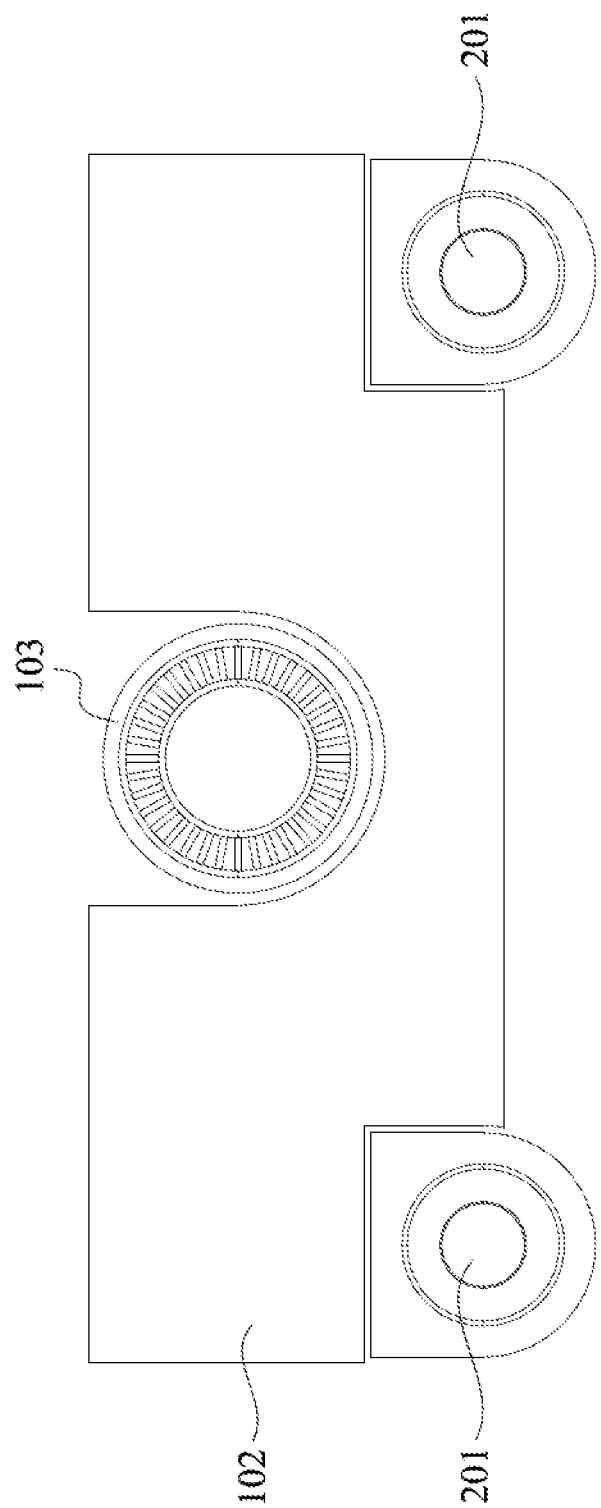
FIG. 2A is a layout of a thermal conduction component, a heat dissipation fan, and cooling fans inside a body according to an embodiment of the present disclosure.

Reference is made to FIG. 2A. FIG. 2A is a layout of a thermal conduction component 102, a heat dissipation fan 103, and two cooling fans 201 inside the body 100 according to some embodiments of the present disclosure. As shown in FIG. 2A, the cooling fans 201 are disposed adjacent to the thermal conduction component 102. The cooling fans 201 are configured to increase the intake volume of cold air. Although FIG. 2A shows only two cooling fans 201, it should be understood that the body 100 may include any number of cooling fans 201 while remaining within the scope of the present disclosure.

Figure 2C:
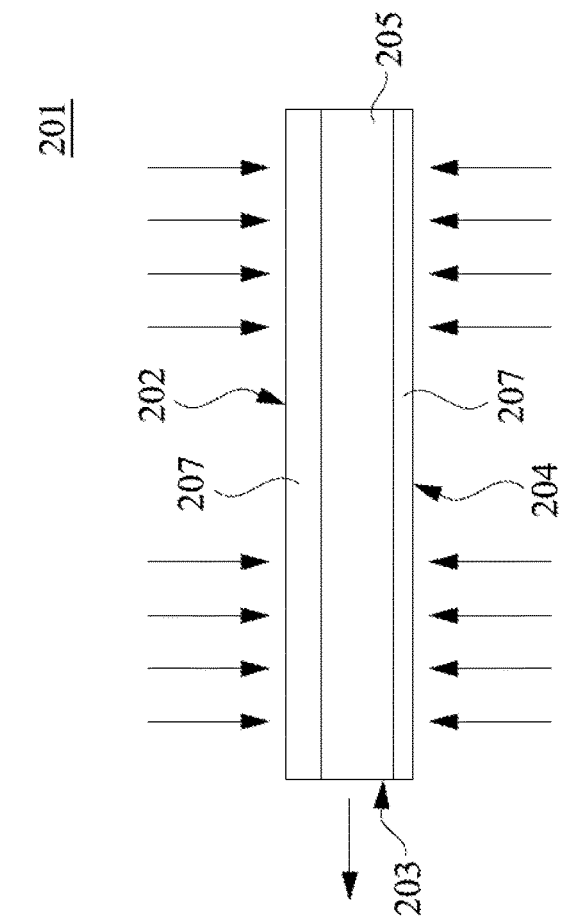
FIG. 2C is a side view of a cooling fan according to an embodiment of the present disclosure.
Figure 2B:
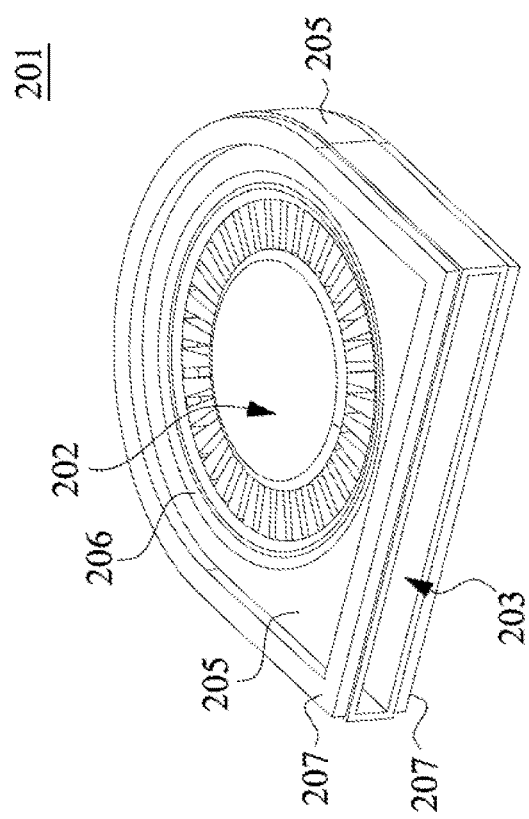
FIG. 2B is a perspective view of a cooling fan according to an embodiment of the present disclosure.

Reference is made to FIG. 2B and FIG. 2C, which illustrate a perspective view and a side view of the cooling fan 201 according to some embodiments of the present disclosure. As shown in FIG. 2B and FIG. 2C, the cooling fan 201 includes a third axial air inlet opening 202, a fourth axial air inlet opening 204, and a side air outlet opening 203. The third axial air inlet opening 202 corresponds to another of the air inlet ports 112-1 and 112-2 of the first housing part 110, such as the air inlet port 112-2 on one side of the first housing part 110. The fourth axial air inlet opening 204 is opposite to the third axial air inlet opening 202. The fourth axial air inlet opening 204 corresponds to another of the air inlet ports 122-1 and 122-2 of the second housing part 120, such as the air inlet port 122-2 on one side of the second housing part 120.

In the embodiment depicted in FIG. 2A, the side air outlet openings 203 of the cooling fans 201 direct toward the heat dissipation port 101. The cooling fans 201 take in cold air from outside the system. The introduced cold air blows from the side air outlet openings 203 to the heat dissipation port 101. The cold air exchanges heat with the thermal conduction component 102. The hot air generated thereafter is discharged outside the body 100 through the heat dissipation port 101. Meanwhile, the subsequently enhanced air convection inside the body 100 mitigates the heat accumulation in the dead zone of the (thermal) flow field.

As shown in FIG. 2B and FIG. 2C, in some embodiments, the cooling fan 201 further includes a fan housing 205, a first block body 207, and a plurality of second block bodies 206. The fan housing 205 has a third axial air inlet opening 202, a fourth axial air inlet opening 204, and a side air outlet opening 203. The first block body 207 surrounds the fan housing 205. The first block body 207 is configured to hinder the heat carried by portions of the thermal conduction component 102 adjacent to the cooling fan 201 from heating the cooling fan 201. If the heating occurs, it may cause the cold air introduced by the cooling fan 201 to be heated and reduce the cooling efficiency. The second block bodies 206 are disposed at the fan housing 205 and around outer edges of the third axial air inlet opening 202 and the fourth axial air inlet opening 204. The second block bodies 206 abut against the first housing part 110 and the second housing part 120. The purpose of the second block bodies 206 is to ensure that the air introduced by the third axial air inlet opening 202 and the fourth axial air inlet opening 204 comes primarily from outside the body 100 rather than from the relatively hot air circulating in the body 100.

Figure 2D:
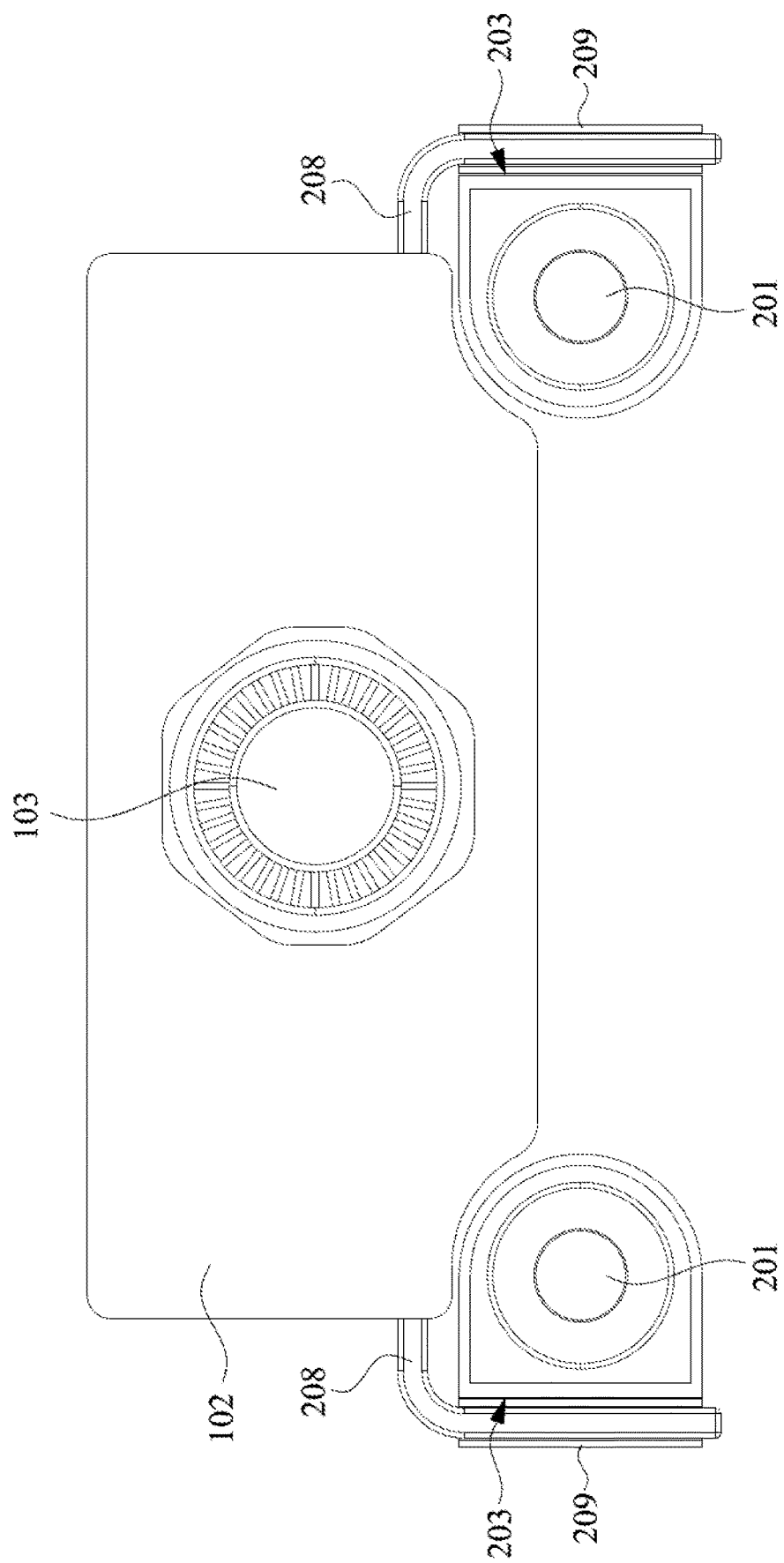
FIG. 2D is a layout of a thermal conduction component, a heat dissipation fan, and cooling fans inside a body according to another embodiment of the present disclosure.

Reference is made to FIG. 2D, which illustrates a layout of a thermal conduction component 102, a heat dissipation fan 103, and cooling fans 201 inside a body 200 according to some other embodiments of the present disclosure. As shown in FIG. 2D, the cooling fans 201 are disposed adjacent to the thermal conduction component 102. Although FIG. 2D shows only two cooling fans 201, it should be understood that the body 200 may include any number of cooling fans 201 while remaining within the scope of the present disclosure.

In some embodiments, the side air outlet openings 203 of the cooling fans 201 direct away from the heat dissipation port 101. For example, as shown in FIG. 2D, the outlet direction of the side air outlet openings 203 of the cooling fans 201 are perpendicular to that of the heat dissipation port 101. Besides, the outlet directions of the two cooling fans 201 are opposite to each other. Corresponding to the positions of side air outlet openings 203 of the two cooling fans 201, the side housing part 130 is further provided with two cooling ports 210 (referring to FIG. 2E). As shown in FIG. 2D, the thermal conduction component 102 further includes heat conducting elements 208. The heat conducting elements 208 are configured to direct heat from the thermal conduction component 102 to specific positions for heat dissipation. As shown in FIG. 2D, the two heat conducting elements 208 extend to the places between the side air outlet openings 203 of the two cooling fans 201 and the two cooling ports 210.

In some embodiments, as shown in FIG. 2D, heat exchangers 209 (for example, heat dissipation fins) are further provided to increase the heat convection and radiation area. One side of each heat exchanger 209 is located in front of the side air outlet opening 203 of the corresponding cooling fan 201. The other side of the heat exchanger 209 corresponds to the corresponding cooling port 210 of the side housing part 130 (referring to FIG. 2E).

Specifically, the heat dissipation fan 103 take in cold air from outside the system. The introduced cold air blows radially from the radial air outlet openings 105 to the thermal conduction component 102 in different directions. As such, the heat absorbed from the heat source to the thermal conduction component 102 can disperse more effectively. Part of the heat is guided to the side air outlet openings 203 of the cooling fans 201 through the heat conducting elements 208. The hot air generated thereafter is discharged outside the body 200 through the heat dissipation port 101 (referring to FIG. 2E). Meanwhile, the cooling fans 201 take in air from outside the system as well. The introduced cold air blows out through the side air outlet openings 203 and exchanges heat with the heat exchangers 209 (referring to FIG. 2E). The hot air generated thereafter is discharged outside the body 200 through the cooling ports 210 (referring to FIG. 2E).

As in the embodiment depicted in FIG. 2D, the fan housing 205 and the first block body 207 shown in FIG. 2B and FIG. 2C enable each of the heat dissipation fan 103 and two cooling fans 201 to have an independent (thermal) flow field. As such, unnecessary heat transfer caused by the hot air circulating in the body 200 may reduce.

Figure 2E:
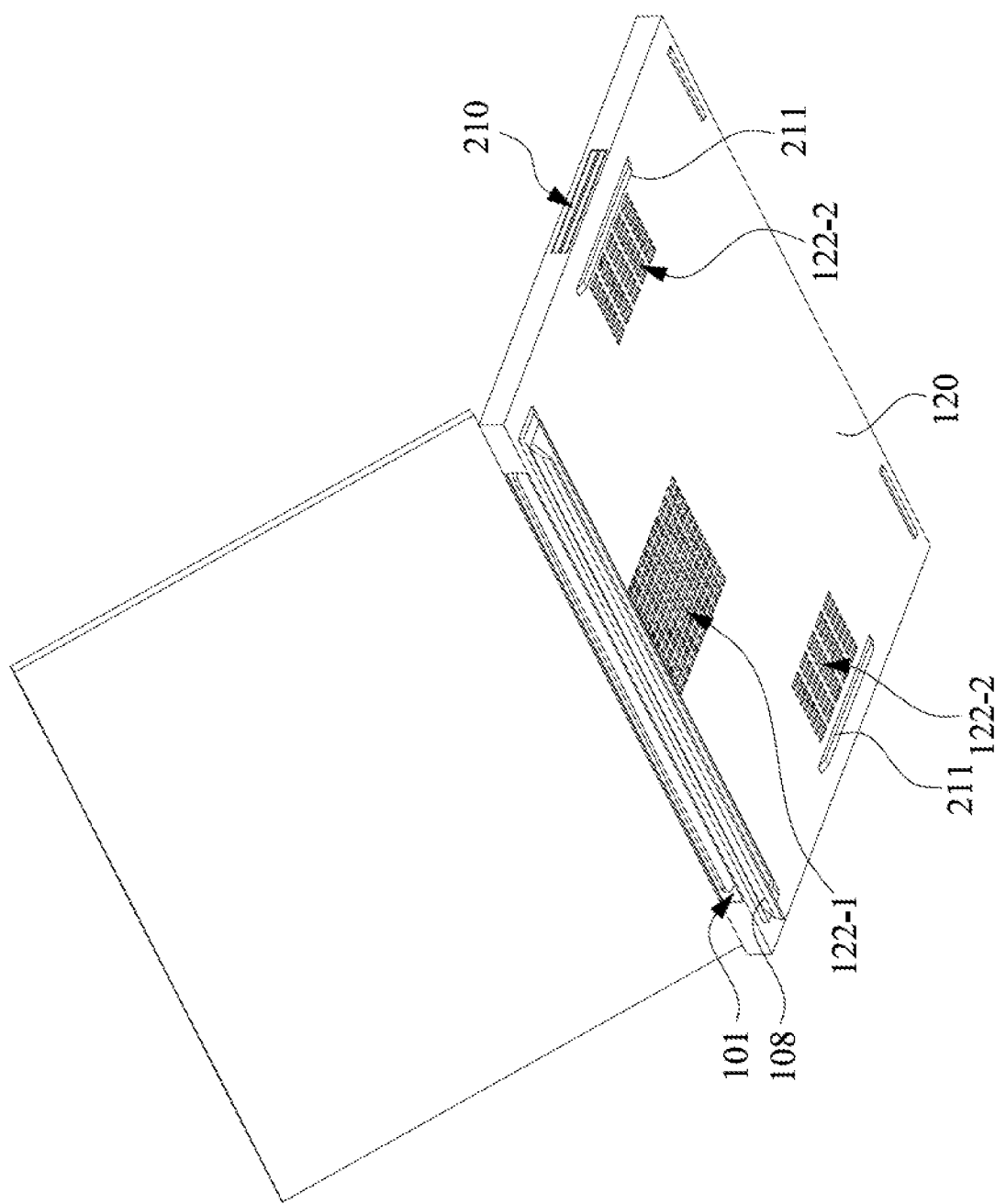
FIG. 2E is a rear view of a body according to another embodiment of the present disclosure.

Reference is made to FIG. 2E, which illustrates a rear view of the body 200 according to some other embodiments of the present disclosure. As shown in FIG. 2E, in some embodiments, in addition to the retractable stand 108 that can also serve as a blocking pad, the body 200 can further include two blocking pads on the side of the second housing part 120 away from the first housing part 110. The blocking pads 211 are disposed along the side direction of the second housing part 120 and lie between the air inlet ports 122-2 of the second housing part 120 and the cooling ports 210. In this case, the blocking pads 211 can prevent the hot air discharged through the cooling ports 210 from entering the body 200 through the air inlet ports 122-2 again.

According to the foregoing recitations of the embodiments of the disclosure, it may be seen that in the air cooling system of the present disclosure, through the air inlet ports disposed at the first housing part and the second housing part, the intake volume of the cold air is increased, thereby improving the cooling efficiency. In addition, the retractable stand lifts the body to increase the amount of cold air intake, particularly at the air inlet port of the second housing part. Meanwhile, to prevent hot air from flowing back into the system, the blocking pads separate the air intake of the air inlet ports of the second housing part from the air exhaust of the heat dissipation port or the cooling ports. Furthermore, by the working fluid of the heat dissipation fan, the thermal conduction component distributes the heat from the heat source. The cooling fans further enhance convection, which makes heat dissipation more effective. Therefore, compared with the air cooling systems commonly used, the air cooling system of the present disclosure can enhance cooling and prevent overheating of electronic devices.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. An air cooling system for electronic devices, comprising:
a body having a heat dissipation port and a plurality of air inlet ports, wherein the air inlet ports are respectively disposed at a first housing part and a second housing part of the body, and the first housing part is opposite to the second housing part;
a thermal conduction component disposed in the body and configured to thermally contact a heat source; and
a heat dissipation fan disposed in the body and comprising:
a first axial air inlet opening corresponding to one of the air inlet ports of the first housing part;
a second axial air inlet opening opposite to the first axial air inlet opening and corresponding to one of the air inlet ports of the second housing part; and
a plurality of radial air outlet openings, wherein a working fluid generated by the heat dissipation fan flows from the radial air outlet openings to the thermal conduction component in different directions, wherein the thermal conduction component fully encircles the heat dissipation fan.

2. The air cooling system of claim 1, wherein the thermal conduction component comprises a vapor chamber, a heat pipe, a graphite sheet, or a highly conductive metal.

3. The air cooling system of claim 1, wherein the body further comprises at least one retractable stand connected to a side of the second housing part away from the first housing part.

4. The air cooling system of claim 1, wherein the body further comprises at least one blocking pad connected to a side of the second housing part away from the first housing part, and the at least one blocking pad is disposed between the air inlet ports of the second housing part and the heat dissipation port.

5. The air cooling system of claim 1, wherein the body further comprises a side housing part, the side housing part connects the first housing part and the second housing part, and the heat dissipation port is disposed at the side housing part.

6. The air cooling system of claim 5, further comprising a cooling fan disposed adjacent to the thermal conduction component, wherein the cooling fan comprises:
- a third axial air inlet opening corresponding to another of the air inlet ports of the first housing part;
- a fourth axial air inlet opening opposite to the third axial air inlet opening and corresponding to another of the air inlet ports of the second housing part; and
- a side air outlet opening.

7. The air cooling system of claim 6, wherein the thermal conduction component comprises a vapor chamber, a heat pipe, a graphite sheet, or a highly conductive metal.

8. The air cooling system of claim 6, wherein the body further comprises at least one retractable stand connected to a side of the second housing part away from the first housing part.

9. The air cooling system of claim 6, wherein the side air outlet opening of the cooling fan directs toward the heat dissipation port.

10. The air cooling system of claim 9, wherein the body further comprises at least one blocking pad connected to a side of the second housing part away from the first housing part, and the at least one blocking pad is disposed between the air inlet ports of the second housing part and the heat dissipation port.

11. The air cooling system of claim 6, wherein the side air outlet opening of the cooling fan directs away from the heat dissipation port, a cooling port is disposed at the side housing part and corresponds to the side air outlet opening, and the thermal conduction component further comprises at least one heat conducting element extending between the side air outlet opening and the cooling port.

12. The air cooling system of claim 11, wherein the body further comprises at least one blocking pad connected to a side of the second housing part away from the first housing part, and the at least one blocking pad is disposed between the air inlet ports of the second housing part and the heat dissipation port or the cooling port.

13. The air cooling system of claim 6, wherein the cooling fan further comprises:
- a fan housing having the third axial air inlet opening, the fourth axial air inlet opening, and the side air outlet opening; and
- a first block body surrounding the fan housing.

14. The air cooling system of claim 6, wherein the cooling fan further comprises:
- a fan housing having the third axial air inlet opening, the fourth axial air inlet opening, and the side air outlet opening; and
- a plurality of second block bodies disposed at the fan housing, around outer edges of the third axial air inlet opening and the fourth axial air inlet opening, and respectively abutting against the first housing part and the second housing part.

* * * * *